United States Patent [19]

Kaiser et al.

[11] Patent Number: 5,151,041
[45] Date of Patent: Sep. 29, 1992

[54] DEVICE FOR CONNECTING AND DISCONNECTING FIRST AND SECOND ELECTRICAL CONNECTOR PARTS

[75] Inventors: Lutz Kaiser, Herrenberg; Eugen Kimmerle, Holzgerlingen; Erich Mirbach, Sindelfingen; Frank Notter, Nufringen, all of Fed. Rep. of Germany

[73] Assignee: International Business Machines Corporation, Armonk, N.Y.

[21] Appl. No.: 781,570

[22] Filed: Oct. 22, 1991

[30] Foreign Application Priority Data

Dec. 28, 1990 [DE] Fed. Rep. of Germany ....... 4042060

[51] Int. Cl.⁵ ........................................... H01R 13/00
[52] U.S. Cl. .................................................... 439/157
[58] Field of Search ................................ 439/152-157

[56] References Cited

U.S. PATENT DOCUMENTS

| | | | |
|---|---|---|---|
| 2,993,187 | 7/1961 | Bisbing et al. | 439/157 |
| 3,476,258 | 11/1969 | Dorsett | 439/157 |
| 4,233,646 | 11/1980 | Leung et al. | 439/157 |

FOREIGN PATENT DOCUMENTS 0369025 5/1990 European Pat. Off. .

Primary Examiner—Joseph H. McGlynn
Attorney, Agent, or Firm—Lawrence R. Fraley

[57] ABSTRACT

A device for connecting and disconnecting connector parts, one movable and the other fixedly positioned within a housing (e.g., electronic cage). The device includes latches which are pivotedly arranged on the upper and lower corner portions of a protection structure covering a printed circuit card and flexible elements, in particular U-shaped springs, which are positioned on inflexible catch bar members which may be secured to or form part of the housing. The latches engage the flexible elements (which each include a cam member) only after a connection has been made between the mating connector parts. The initial position of the cams determines the magnitude of the insertion force needed to complete the connection. After connection has been established, the pressure occurring between the connector elements of the connected parts is largely reduced due to the ability of the cam (and flexible element) to flex, allowing the latch (and associated card) to partly withdraw away from the fixed connector (and associated board). Effective connection is thus possible between connector parts including high density numbers of contacts.

9 Claims, 6 Drawing Sheets

DEVICE FOR CONNECTING AND DISCONNECTING FIRST AND SECOND ELECTRICAL CONNECTOR PARTS

DESCRIPTION

1. Technical Field

The present invention relates to devices for connecting and disconnecting various electrical components (e.g., printed circuit cards and boards) within a housing such as an electronic cage for use in information handling systems (computers.)

2. Background of the Invention

In practice, forming electrical connections such as the above demand special treatment. For example, such connections must be designed so that the contacts (which are to become engaged to form the connection) do not become disconnected when subjected to different loads and stresses, such as those imposed by vibration, temperature differences, etc. In addition, connection formation should be performed in a user friendly environment such that said connections are relatively easy to connect and disconnect.

To meet such requirements, various connectors often include latch means for connection and disconnection. Such means ensure that mated contacts remain reliably closed and prevented from opening during operation of the electronic assembly (e.g., computer) in which these are utilized.

European patent application 0 369 025 describes a device by which printed circuit cards can be connected to and disconnected from larger circuit structures (a/k/a boards). This device comprises a resilient latch member which is connected to the card and has a movable end portion, and an operating lever which is pivotally arranged on the card. The operating lever and latch member are positioned relative to each other such that when the operating lever is actuated, its curved surface causes the latch member to perform a translatory movement, so that card and board are electrically connected. The movable end portion then drops into a groove provided on the operating lever where it remains so that the card is fixed in that position. This device has the disadvantage that the insertion force is permanently exerted on the larger board, so that, while the card is connected, the board is subject to considerable stress. In addition, the great number of contacts to be made by the connector increases the insertion force such that it may bend the board. A board permanently bent in such a way may develop cracks which in turn may damage the printed conductor circuits thereon. Another disadvantage is that the connector is usually only suitable for a limited number of contacts, so that large cards with several contacts cannot be latched by such a device. As a result, these functions must be distributed over several cards, which in turn necessitates larger housings, an undesirable necessity.

Another device for latching and disconnecting a circuit card in an electronic housing (a/k/a cage) consists of latches, arranged in the upper and lower corners of the card or the card's protection housing, and a catch means fixed to the cage housing. The catch means is functionally associated with each latch such that the latch is capable of engaging the catch means only after the card and associated, larger board have been electrically connected. A primary disadvantage of this device is that the pressure required for connecting card and board is exerted on the connector components during their entire operation. In addition, the aforementioned device possesses similar disadvantages as that of the the structure in the aforementioned European application 0 369 025.

DISCLOSURE OF THE INVENTION

It is, therefore, the object of the invention to provide a device for connecting and disconnecting two connector parts (e.g., a printed circuit card to a connector positioned on and electrically coupled to a housed circuit board), which allows linking connectors with a maximum number of contacts and in which the force required therefor is not permanently exerted on the connector components but substantially reduced after connection is attained.

In accordance with one aspect of the invention, there is provided a device for connecting and disconnecting movable and fixed connector parts to provide an electrical connection therebetween and for breaking such connection, if desired. The device comprises at least two movable latches which are separately supported on said movable connector part, and at least two catch members which are separately positioned on said housing so that each latch is functionally associated with a respective one of said catch members, said latches and said catch members being positioned relative to each other such that said latches engage said catch members only after said movable connector part and said fixedly positioned connector part are connected, at least part of each of said catch bar members engaged by said latch member being resilient such that during such engagement by said latch members, said latch members are movable away from said housing to thereby substantially reduce the force on said connected connector parts.

The advantages obtained by the invention are in particular that the device allows linking connector parts each having a very large number of contacts. The surface areas of the connector parts are subject to pressure only during the initial connection. Once said electrical connection has been made, the pressure exerted on the parts is, significantly, substantially reduced. This permits increasing the functional density of cards used, for example, in information handling systems, which increase is highly desirable from a design standpoint. Another advantage of this invention is that the space required for card storage is reduced and smaller size cards/boards may be used. In addition, particular functions on the board are rendered superfluous, as fewer cards may be required. This, in turn, simplifies card production.

BRIEF DESCRIPTION OF THE DRAWINGS

The device according to the invention will be described in detail below by way of an information handling (e.g., data processing) system, in particular for connecting cards to a board within a housing for use therein, as shown in the accompanying drawings, in which.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
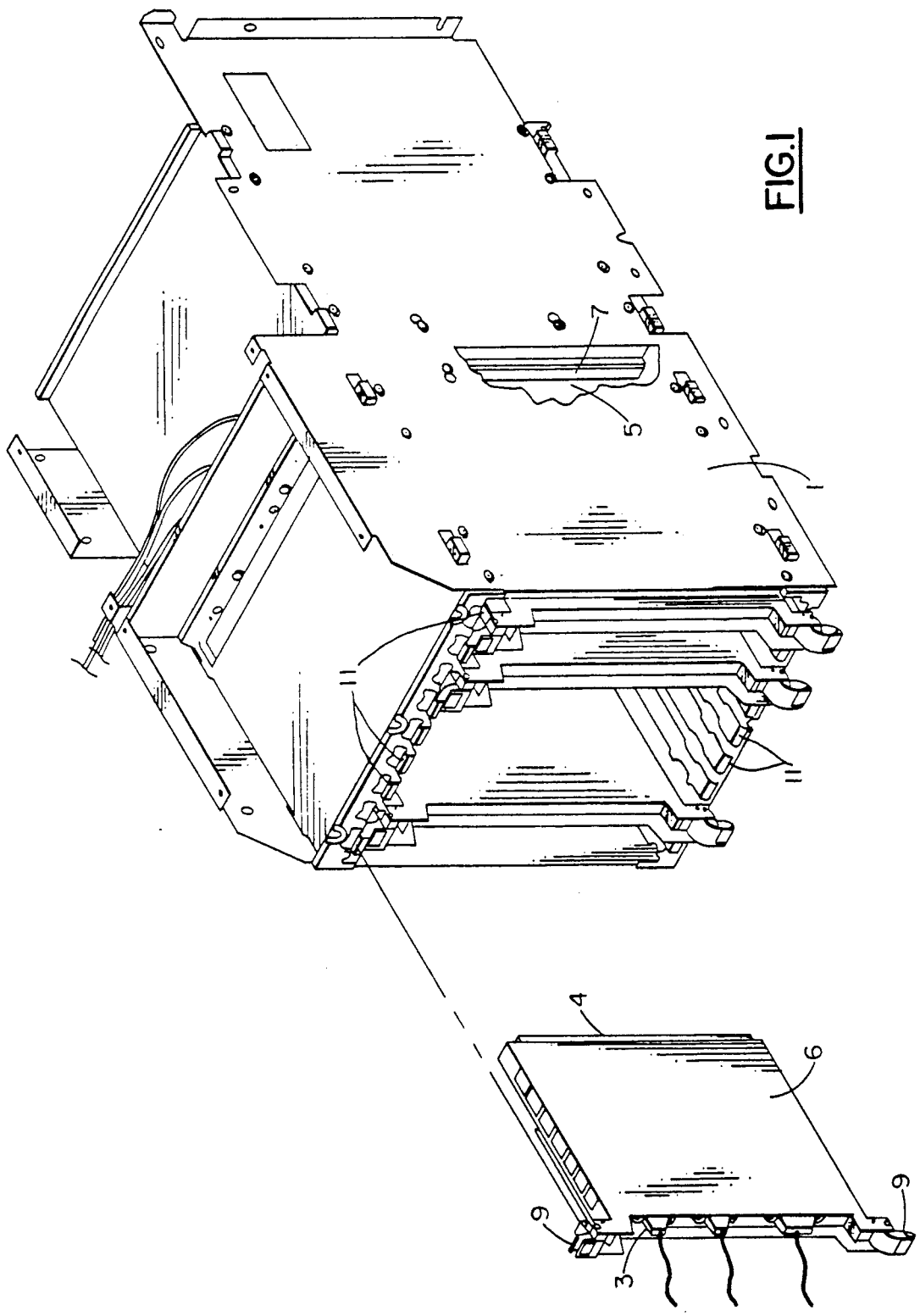
FIG. 1 is a perspective view of the housing (e.g., electronic cage) accommodating a board and various cards, said cards and board being connected by the device according to the invention.

FIG. 1 shows one or several printed circuit cards 3 adapted for being inserted, in parallel (guided within), into a housing 1 where they are adapted for being electrically coupled to a board 5. The cards 3 are each generally accommodated in a protection housing 6 for shielding purposes, e.g., against electromagnetic radiation. Housing 1 is preferably an electronic cage housing, such cages typically used in various computer assemblies. Protection housing 6 has an aperture from which a male contact connector part 4, linked with a female contact connector part 7 of the board 5, protrudes. Part 7, including contacts therein for engaging respective elements on part 4, is positioned on and electrically coupled to the circuitry of board 5. Part 7 and a portion of board 5 can be seen through the partial removal of the side of housing 1 nearest the viewer in FIG. 1. It is understood that mating of these two parts, first part 4 and second part 7, results in an electrical connection therebetween. The top and the bottom, spaced apart corners on one side of the protection housing 6 are each fitted with one latch 9, each of which is pivotally supported on housing 6. Latches 9 are thus associated with the movable connector part 4. If the protection housing 6 for shielding card 3 is not utilized, e.g., for technical reasons, latch 9 may be pivotally connected directly on card 3. As is known, part 4 may comprise a plurality of contacts along a leading (forward) edge of card 3, such contacts including, for example, printed circuit traces extending substantially to the card's leading edge. As also known, part 7 may comprise an electrical connector including an insulative housing containing therein several contacts. The electrical housing of part 7, in this situation, would be fixedly positioned on the board's facing surface (as shown in FIG. 1) and a slot provided in the electrical housing's upper portion. The edge of card 3 is then inserted within the slot whereby the contacts in part 7 engage respective ones of those on the card's edge. The part 7 contacts also may extend through the housing to be inserted within board 5 and thereby coupled to the board's internal circuitry.

The upper and the lower, spaced apart regions of housing 1 are provided with catch bars 11 which are engaged by latches 9 only after the contact connector part 7 on board 5 and the contact connector part 4 associated with card 3 have been electrically connected. Catch bars 11 may be arranged on housing 1 individually or jointly, and are thus associated with the connector part 7 securedly positioned within the housing 1. Understandably, connector part 4 is thus movable in comparison to the fixedly positioned connector part 7. More specifically, the male part 4 is designed for being inserted within (to form an electrical connection) and removed from (to result in a disconnection) the female part 7.

FIGS. 2, 3, 4 and 5 illustrate in greater detail how the individual parts of the device according to the invention are related.

Figure 2:
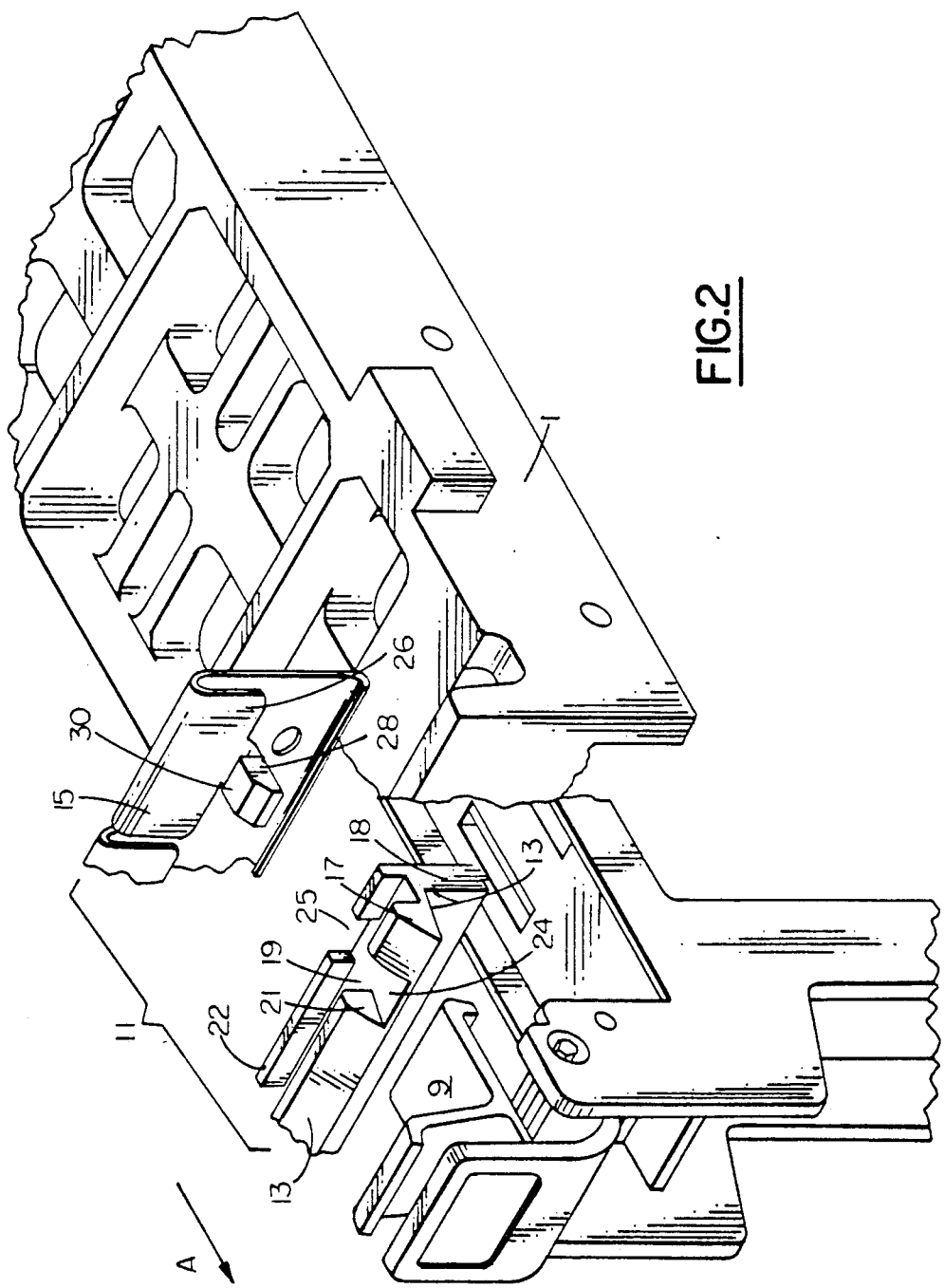
FIG. 2 is a perspective, exploded view of the device according to the invention, FIG. 2 being much enlarged over the view in FIG. 1.

Catch bar 11, as best seen in FIG. 2, includes an inflexible (fixed) catch element 13 and a flexible (resilient) catch element 15 secured thereto, which element 15 may, in a preferred embodiment, comprise a U-shaped spring. The inflexible catch element 13 is secured to or forms part of housing 1. The flexible 10 catch element 15 is designed as an independent element and arranged on (secured to) the inflexible catch element 13. See especially FIG. 5. It is understood that a catch bar 11, similar to the catch bar shown on the upper portion of housing 1 in FIG. 2, is also located on the housing's lower portion to accommodate the bottom latch 9 in FIG. 1. Thus, upper and lower latches 9 mate with respective upper and lower catch bar structures 11, on housing 1. The inflexible catch element 13 has two legs 17 and 18 extending orthogonally to each other, the inflexible catch element 13 being positioned on housing 1 such that one leg 18 is arranged parallel to housing 1 whereas the other leg 17 extends orthogonally to leg 18. The upper region of leg 17 is provided with a recess 19 such that two bars 21, 22, extending parallel to each other and the surface of leg 18, are thus also connected to housing 1, and are formed on either side. The two bars 21 and 22 are interrupted by recesses 24 and 25, which lie opposite each other in a paired relationship on leg 17. The U-shaped spring 15, with curved end segments which extend backward toward each other (FIG. 5) is fixed to (wrapped about) the inflexible catch element 13 (FIG. 5) such that the two segments enclose bar 22 so that the upper curved bent segment of the spring 15 rests against the inside of bar 22. For spring 15, bar 22 thus acts as a stop. One segment (leg) 26 (FIG. 2) of the spring 15 is provided on its movable end with a tongue 28 projecting from the spring and which is positioned substantially orthogonally to leg 26. On this tongue 28, a cam 30 is positioned. Spring 15 is positioned on bar 22 such that the projecting tongue 28 is reciprocally movable substantially parallel to the base of the recess 24 between bars 21 and 22. Cam 30 is shown in recess 24 and also within bar 21 in FIG. 5.

Bar 21 is ramp-shaped (angular) so that pivotal latch 9 may be readily moved across bar 21. Significantly, cam 30 determines the point up to which latch 9 has to be moved for electrical connection (between parts 4 and 7). Having reached that point, latch 9 snaps into place behind cam 30. As cam 30 is suspended from spring 15, latch 9, along with its associated card 3, moves back in the direction of arrow A (FIG. 2) opposite that of the insertion force up to a point at which the pressure at the connection is substantially reduced. Disconnection (separation of part 4 from part 7) is also prevented by the fact that the width of latch 9 enclosing cam 30, significantly, exceeds the width of the recess 24 in bar 21, so that the return movement of latch 9 with the card 3 is stopped on the inside of the bar 21.

Figure 3:
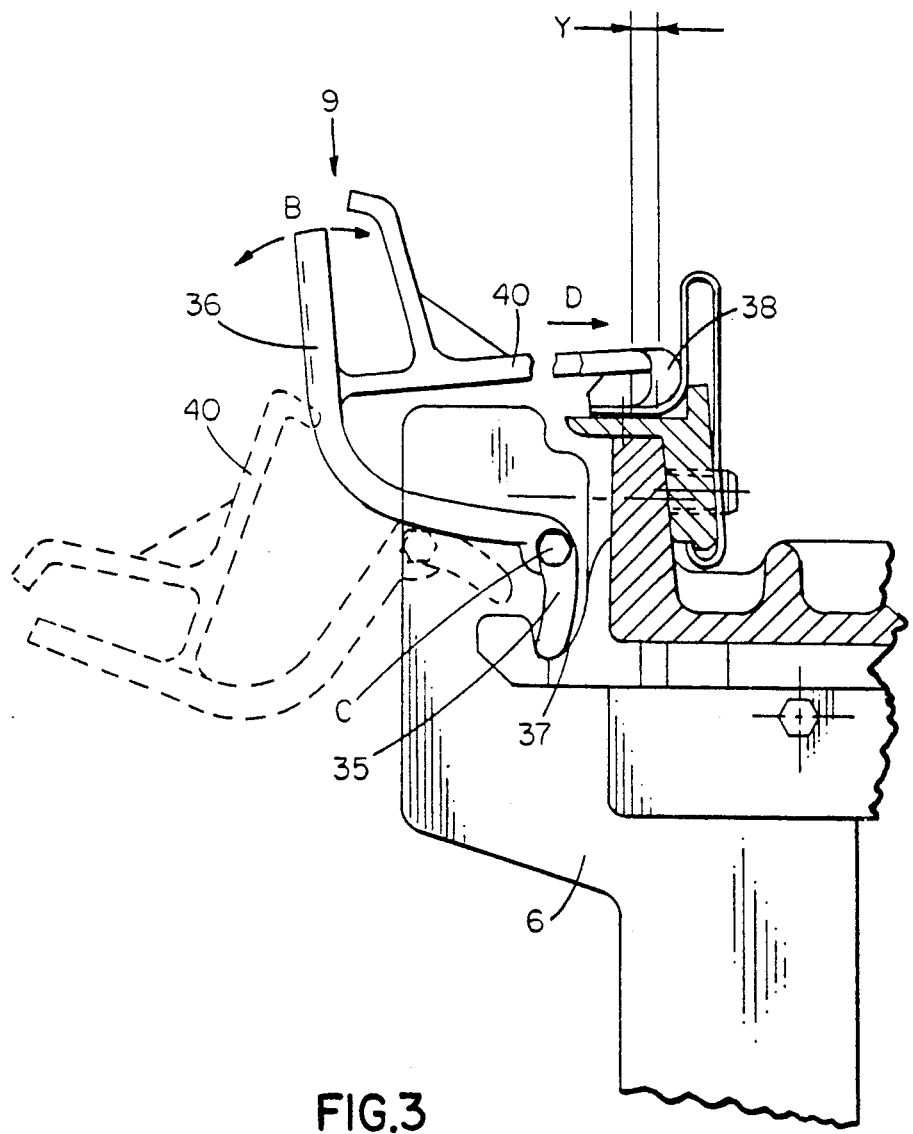
FIG. 3 is a partial cross-sectional, side view of the device according to the invention at a period during which the pressure required for electrically connecting card and board is exerted on the board.

FIG. 3 shows the device according to the invention as card 3 (part 4) and board 5 (having connector part 7 thereon) are being connected. Latches 9 are arranged in the upper and lower corners of an outer end portion of the protection housing 6 of card 3. If the protection housing is omitted (e.g., for technical reasons), latches 9 may be arranged on the card 3 directly, as stated above. Latches 9 are pivotally positioned on housing 6. These latches pivot about an axis C (FIG. 3) and each include two lever arms 35 and 36 of different length, which are arranged in a substantially S-shape relative to each other, as depicted in FIG. 3.

The longer lever arm 36 is movable by hand (or other means) in the direction of arrow B. The short lever arm 35 engages a channel 37 on housing 1 as soon as the protection housing 6 with the card 3 arranged thereon/-therein is in engagement. A latch pawl 40, which end is provided with a perpendicular latch nose segment 38, is arranged on the longer lever arm 36. The short lever arm 35 acts as a toggle lever, i.e. when the longer lever arm 36 with the latch pawl 40 for engaging cam 30 is moved in the direction of arrow D, the short lever arm 35 engages channel 37 in housing 1, leading to an additional insertion force being exerted on the card and the associated protection housing 6. This additional force assures electrical connection between the contact connector part 4 of the card and the contact connector part 7 associated with board 5. Once this connection occurs, latch pawl 40 engages cam 30 with its latch nose 38.

The magnitude of the force required for connecting part 4 (with card 3) and connector part 7 (with board 5) is determined by the position of cam 30, e.g., the position of cam 30 determines the additional distance Y (FIG. 3) by which the card has to be moved before the latch nose 38 of the pawl 40 is capable of engaging cam 30. The card insertion force must, therefore, at least exceed the sum of the spring and frictional forces of the connector contacts in parts 4 and 7. The load this insertion force exerts on the card 3 and the board 5 will now be substantially reduced immediately after the spring forces of these connector contacts have been overcome. Movable cam 30 is thus used to balance the pressure between card 3 and board 5.

The card insertion force required depends upon the number of contacts to be made when card 3 and part 7 on board 5 are connected, and the position of cam 30 on the inflexible catch element 13. Thus, the device according to the invention is adaptable to connectors with varying numbers of contacts.

Figure 4:
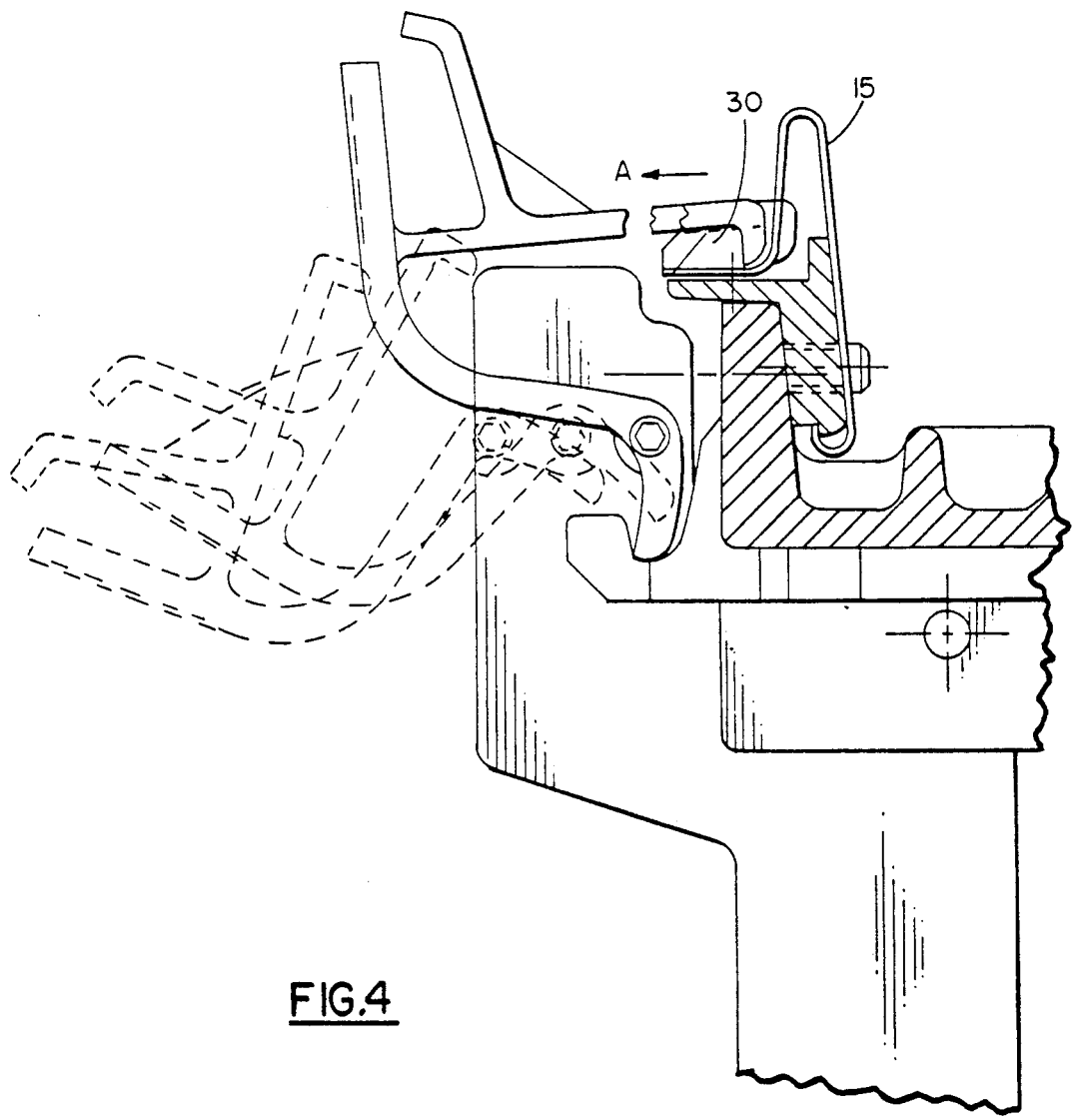
FIG. 4 is a partial cross-sectional, side view, on a scale slightly larger than FIG. 3, of the device according to the invention at a period during which the pressure required for establishing contact between connector parts is substantially reduced by the invention.

FIG. 4 shows the device according to the invention in the unloaded state, e.g., after card 3 and part 7 on board 5 have been electrically connected.

The movable cam 30 balances the pressure between card 3 and board 5. As a result of this and the change in the position of cam 30 in the direction of arrow A (FIG. 2), the spring 15 (and supporting cam 30) is in tension. Spring 15 is designed such that the described connector contacts are not inadvertently opened. For this purpose, the force required for further tensioning the spring 15 must exceed the sum of the frictional forces opening the contacts.

Figure 5:
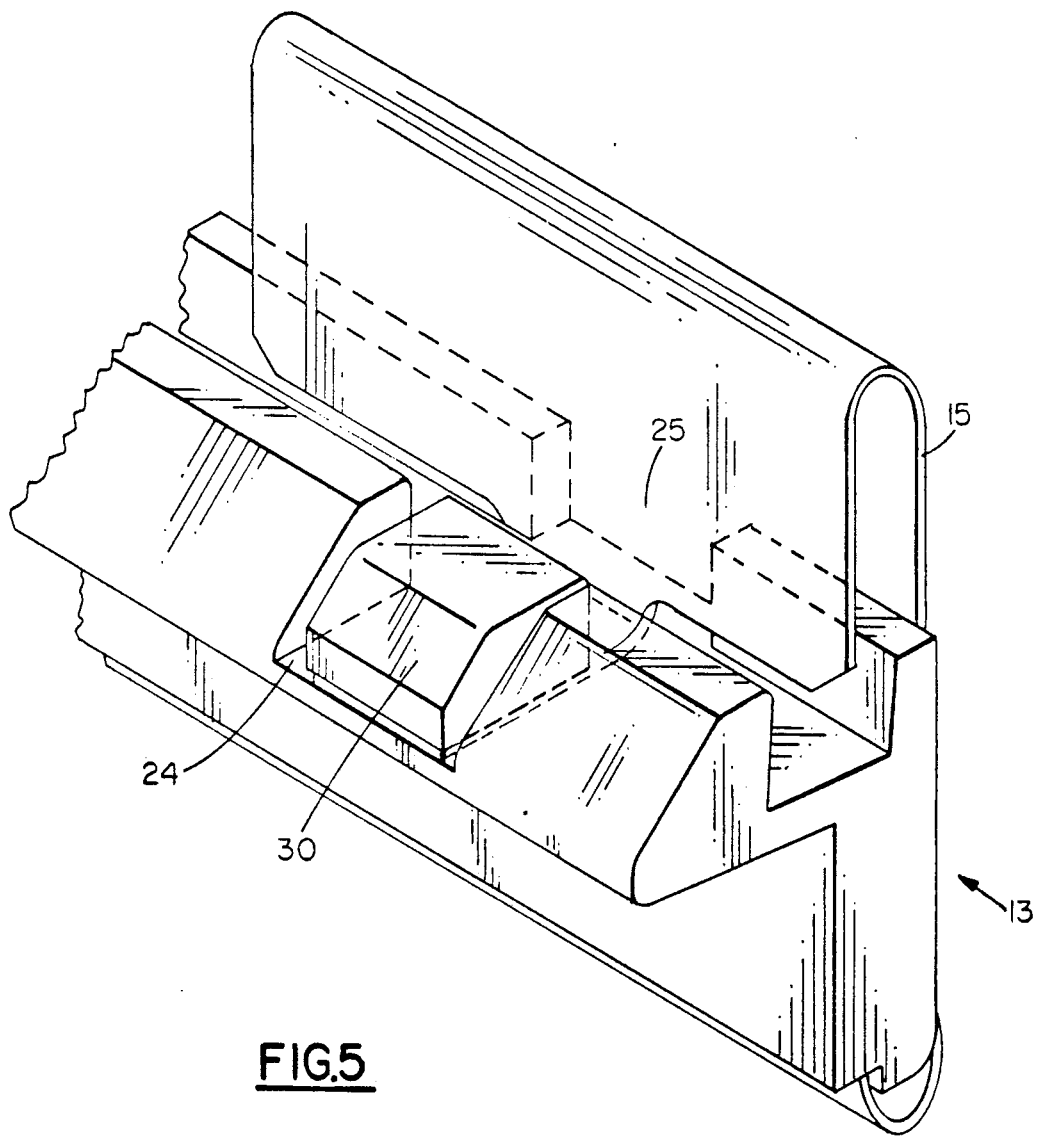
FIG. 5 is a perspective view of a portion of the device according to the invention, which serves to reduce the pressure between connector parts.

FIG. 5 shows in particular the function of recesses 24, 25 on the inflexible catch element 13. Recess 24 allows cam 30 to move on the inflexible catch element 13 such that the pressure between card 3 and board 5 is balanced.

In the broader aspects of the invention, spring 15 may be otherwise secured to housing 1, thereby eliminating the need for catch 14 as particularly shown. It is also technically feasible for the inflexible catch element 13 to consist of a flat plate which is directly connected to housing 1. In this case, spring 15 could surround the plate such that it is self-supporting thereon.

Figure 6:
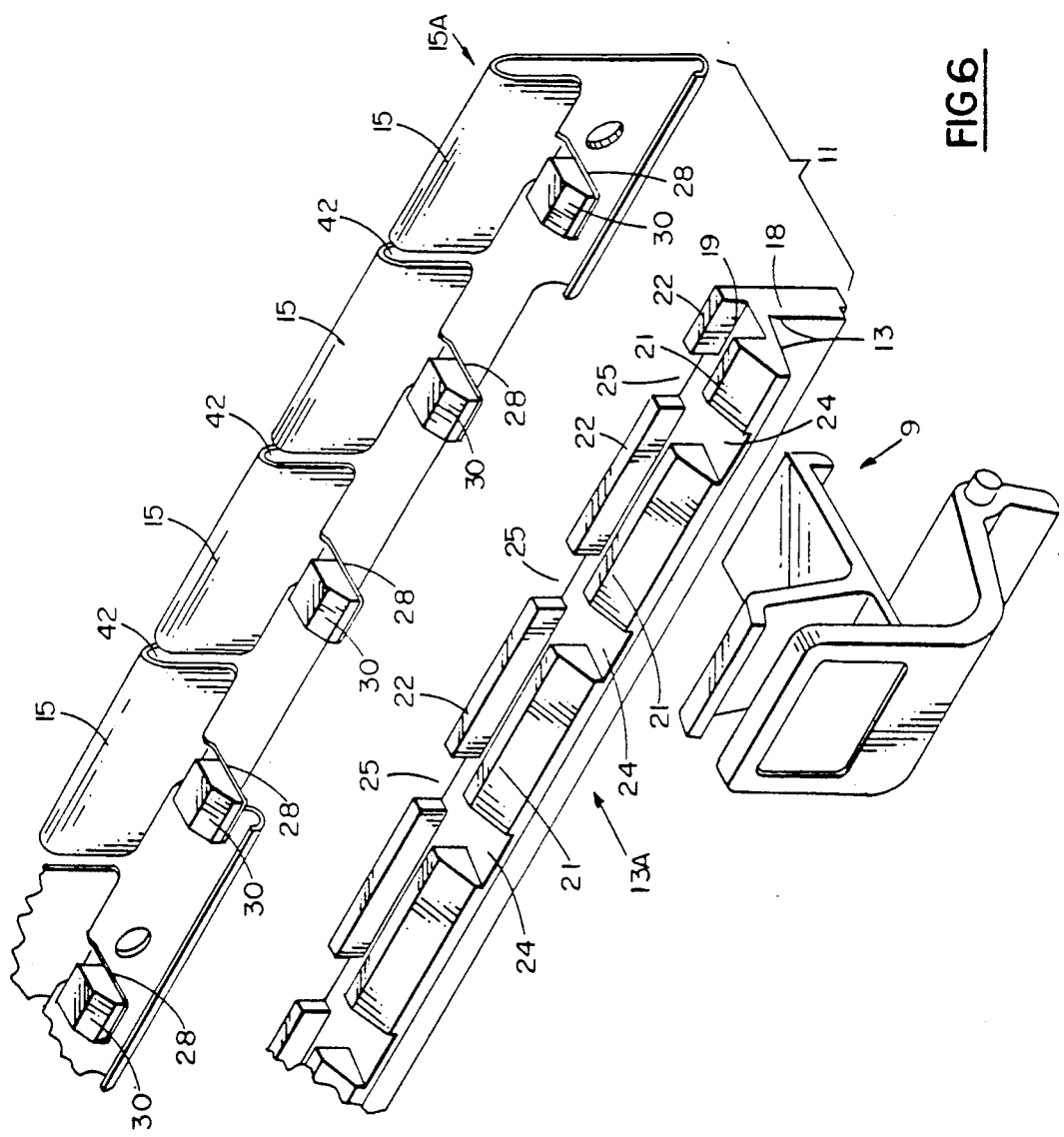
FIG. 6 is a perspective view of the device according to the invention with several cards arranged in parallel.

FIG. 6 shows in particular the design of a spring 15A and associated inflexible catch elements 13 for accommodating several cards 3 for being arranged in parallel within housing 1. Spring 15A includes several individual springs 15, these being separated from each other by a recess 42 so that one movable spring 15 is associated with a respective one card 3 or latch 9. Each spring is fitted with a tongue 28 and a cam 30 positioned thereon, as defined above in FIGS. 2 and 5. The singular, inflexible catch element 13A thus similarly comprises several elements 13, with an elongated recess 19 forming two bars 21, 22, arranged parallel to each other, over the entire length of the singular inflexible catch part 13A. Each spring leg is also associated with a pair of recesses 24 and 25, which allow cam 30 to move for reducing the pressure between card 3 and board 5. Recess 24 is positioned such that the two bars 21 and 22 are interrupted. The size of the interruption allows cam 30 to pass therethrough.

In summary, the advantages of the device according to the present invention are that in particular for connector contacts connected by applying a predetermined force, the contact density of the card and associated receiving part may be substantially increased. The present invention allows the connection of cards being electrically of maximum density without the board to which they are coupled being damaged by the insertion force. Further advantages include the fact that the device according to the invention is relatively easy and inexpensive to produce. Other advantages are also discernible from the teachings provided herein.

While there have been shown and described what are at present considered the preferred embodiments of the invention, it will be obvious to those skilled in the art that various changes and modifications may be made therein without departing from the scope of the invention as defined by the appended claims.

What is claimed is:

1. A device for connecting and disconnecting a first movable connector part from a fixedly positioned second connector part within a housing, said first movable connector part being guided within said housing and adapted for being moved in a first direction toward said housing in response to a predetermined insertion force until said first movable connector part and said fixedly positioned second connector part are connected, said device comprising:

at least two movable latches separately supported at spaced apart locations on said first movable connector part; and at least two movable catch members separately positioned at spaced apart locations on said housing so that each of said latches is functionally associated with a respective one of said catch members, each of said catch members including an inflexible catch element and a flexible catch element positioned on said inflexible catch element and adapted for engaging a respective one of said movable latches, said flexible catch element including a cam member for engaging said latch, said cam member movable in a direction away from said housing in a direction substantially opposite said first direction of said first movable connector part after said first and second connector parts are connected to thereby substantially reduce the force on said connected first and second connector parts.

2. The device as claimed in claim 1 wherein said flexible catch element comprises a substantially U-shaped spring positioned on said inflexible catch element, said spring including a leg element having said cam member thereon, said latch adapted for engaging said cam member.

3. The device as claimed in claim 2 wherein said inflexible element extends transversely on said housing and includes first and second leg members, said leg members positioned substantially orthogonal to each other, said cam member being movable in the plane of one of said leg members.

4. The device as claimed in claim 3 wherein at least one of said leg members includes a recess therein, said cam member movable through said recess when engaged by said latch.

5. The device as claimed in claim 4 wherein said recess with said leg member in which said cam moves is narrower in width than said latch member, said leg member thereby serving as a stop to limit said cam and latch movement after a predetermined distance of travel.

6. The device as claimed in claim 1 wherein each of said latch members includes a pair of lever arms and said housing includes a channel therein, one of said lever arms adapted for being positioned within said channel.

7. The device as claimed in claim 6 wherein the other lever arm of said latch member is adapted for engaging said flexible catch element.

8. The device as claimed in claim 1 wherein said first movable connector part comprises a printed circuit card and said fixedly positioned second connector part comprises a connector located on a circuit board positioned within said housing.

9. The device as claimed in claim 8 said housing is an electronic cage.

* * * * *